(12) United States Patent
Zhong

(10) Patent No.: US 7,930,621 B2
(45) Date of Patent: Apr. 19, 2011

(54) SYSTEMS AND METHODS FOR LDPC DECODING WITH POST PROCESSING

(75) Inventor: Hao Zhong, Bethlehem, PA (US)

(73) Assignee: Agere Systems Inc., Allentown, PA (US)

(*) Notice: Subject to any disclaimer, the term of this patent is extended or adjusted under 35 U.S.C. 154(b) by 991 days.

(21) Appl. No.: 11/756,736

(22) Filed: Jun. 1, 2007

(65) Prior Publication Data

US 2008/0301517 A1 Dec. 4, 2008

(51) Int. Cl.
*G06F 11/00* (2006.01)
*H03M 13/00* (2006.01)

(52) U.S. Cl. .................................................. 714/800

(58) Field of Classification Search .................. 714/751, 714/786, 800–801
See application file for complete search history.

(56) References Cited

U.S. PATENT DOCUMENTS

| | | | |
|---|---|---|---|
| 5,278,846 A | 1/1994 | Okayama et al. | |
| 5,325,402 A | 6/1994 | Ushirokawa | |
| 5,392,299 A | 2/1995 | Rhines et al. | |
| 5,428,646 A * | 6/1995 | Eyuboglu ............. | 375/354 |
| 5,513,192 A | 4/1996 | Janku et al. | |
| 5,612,964 A | 3/1997 | Haraszti | |
| 5,701,314 A | 12/1997 | Armstrong et al. | |
| 5,717,706 A | 2/1998 | Ikeda | |
| 5,844,945 A | 12/1998 | Nam et al. | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister et al. | |
| 6,023,783 A | 2/2000 | Divsalar et al. | |
| 6,029,264 A | 2/2000 | Kobayashi et al. | |
| 6,041,432 A | 3/2000 | Ikeda | |
| 6,097,764 A | 8/2000 | McCallister et al. | |
| 6,216,251 B1 | 4/2001 | McGinn | |
| 6,266,795 B1 | 7/2001 | Wei | |
| 6,317,472 B1 | 11/2001 | Choi et al. | |
| 6,351,832 B1 | 2/2002 | Wei | |
| 6,377,610 B1 | 4/2002 | Hagenauer et al. | |
| 6,438,717 B1 | 8/2002 | Butler et al. | |
| 6,473,878 B1 | 10/2002 | Wei | |

(Continued)

FOREIGN PATENT DOCUMENTS

WO WO 2006/016751 2/2006

(Continued)

OTHER PUBLICATIONS

Seshadri et al., on post-decision symbol reliability generation, 1993, IEEE, p. 741-745.*

(Continued)

*Primary Examiner* — Shelly A Chase

(74) *Attorney, Agent, or Firm* — Hamilton, DeSanctis & Cha

(57) ABSTRACT

Various embodiments of the present invention provide systems and methods for decoding encoded information. For example, a method for post processing error correction in a decoder system is disclosed. The method includes receiving and iteratively decoding a soft input to generate a hard output associated with the soft input. The method further includes post processing when a plurality of parity checks fail. At least one bit of the hard output is identified as being potentially incorrect. The identified bit is modified, and the plurality of parity checks is thereafter repeated.

20 Claims, 5 Drawing Sheets

U.S. PATENT DOCUMENTS

| | | | |
|---|---|---|---|
| 6,625,775 | B1 | 9/2003 | Kim |
| 6,671,404 | B1 | 12/2003 | Kawatani et al. |
| 6,748,034 | B2 | 6/2004 | Hattori et al. |
| 6,757,862 | B1 | 6/2004 | Marianetti, II |
| 6,788,654 | B1 | 9/2004 | Hashimoto et al. |
| 6,810,502 | B2 | 10/2004 | Eidson et al. |
| 6,986,098 | B2 | 1/2006 | Poeppelman et al. |
| 7,010,051 | B2 | 3/2006 | Murayama et al. |
| 7,047,474 | B2 | 5/2006 | Rhee et al. |
| 7,058,873 | B2 | 6/2006 | Song et al. |
| 7,093,179 | B2 | 8/2006 | Shea |
| 7,184,486 | B1 | 2/2007 | Wu et al. |
| 7,191,378 | B2 | 3/2007 | Eroz et al. |
| 7,203,887 | B2 | 4/2007 | Eroz et al. |
| 7,257,764 | B2 | 8/2007 | Suzuki et al. |
| 7,308,061 | B1 | 12/2007 | Huang et al. |
| 7,310,768 | B2 | 12/2007 | Eidson et al. |
| 7,346,832 | B2 | 3/2008 | Richardson et al. |
| 7,415,651 | B2 | 8/2008 | Argon |
| 7,434,136 | B2 * | 10/2008 | Ichihara et al. ............. 714/755 |
| 7,587,657 | B2 | 9/2009 | Haratsch |
| 7,646,829 | B2 | 1/2010 | Ashley et al. |
| 7,673,213 | B2 | 3/2010 | Chugg et al. |
| 7,730,384 | B2 | 6/2010 | Graef et al. |
| 7,779,325 | B2 | 8/2010 | Song et al. |
| 2004/0098659 | A1 | 5/2004 | Bjerke et al. |
| 2005/0216819 | A1 | 9/2005 | Chugg et al. |
| 2007/0047635 | A1 | 3/2007 | Stojanovic et al. |
| 2008/0049825 | A1 | 2/2008 | Chen et al. |
| 2008/0168330 | A1 | 7/2008 | Graef et al. |

FOREIGN PATENT DOCUMENTS

| | | |
|---|---|---|
| WO | WO 2006/091797 | 8/2007 |

OTHER PUBLICATIONS

Zhong, Hao et al., Joint Code-Encoder-Decoder Design for LDPC Coding System VLSI Implementation, Rensselaer Polytechnic Institute, printed Apr. 2007 from "www.ecse.rpi.edu".

Zhong, Hao et al., Block-LDPC: A Practical LDPC Coding System Design Approach, IEEE, Jul. 2004, printed Apr. 2007 from "www.ecse.rpi.edu".

Moon, Todd K., Error Correction Coding, 2005, pp. 640-649 John K. Wiley & Sons Inc., Hoboken, NJ.

Collins and Hizlan, "Determinate State Convolutional Codes" IEEE Transactions on Communications, Dec. 1993.

Eleftheriou, E. et al., "Low Density Parity Check Codes for Digital Subscriber Lines", Proc ICC 2002, pp. 1752-1757.

Han and Ryan, "Pinning Techniques for Low-Floor Detection/Decoding of LDPC-Coded Partial Response Channels", 5th International Symposium on Turbo Codes &Related Topics, 2008.

Mohsenin et al., "Split Row: A Reduced Complexity, High Throughput LDPC Decoder Architecture", pp. 1-6, printed from www.ece.ucdavis.edu on Jul. 9, 2007.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Yeo et al., "VLSI Architecture for Iterative Decoders in Magnetic Storage Channels", Mar. 2001, pp. 748-755, IEEE trans. Magnetics, vol. 37, No. 2.

Zhong et al., "Area-Efficient Min-Sum Decoder VLSI Architecture for High-Rate QC-LDPC Codes in Magnetic Recording", pp. 1-15, Submitted 2006, not yet published.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "VLSI Architecture of LDPC Based Signal Detection and Coding System for Magnetic Recording Channel", Thesis, RPI, Troy, NY, pp. 1-95, May 2006.

* cited by examiner

SYSTEMS AND METHODS FOR LDPC DECODING WITH POST PROCESSING

BACKGROUND OF THE INVENTION

The present invention is related to systems and methods for decoding information, and more particularly to systems and methods for LDPC decoding with post processing.

A number of encoding/decoding schemes have been developed to meet the needs for, among other things, data storage and data transmission. As one example, low-density parity-check (LDPC) codes have been developed that provide excellent error correcting performance using a highly parallelized decoding algorithm.

Turning to FIG. 1, an exemplary transmission system 100 utilizing an LDPC encoder and a separate LDPC decoder is depicted. Transmission system 100 includes a transmission device 110 and a receiving device 160. Transmission device 110 includes an information source 120 that provides a stream of information to an LDPC encoder 130. LDPC encoder 130 encodes the received stream of information and provides an encoded data set to a transmitter 140. Transmitter 140 modulates the encoded data set to create a transmitted data set 150 that is received by a receiver 190 of receiving device 160. Receiver 190 demodulates the encoded data set and provides it to an LDPC decoder 180 that decodes the encoded data set and provides the decoded information as received information 170.

If only a limited number of errors occur in transmitted data set 150, LDPC decoder 18C will after a finite number of iterations come to a result representing the actual information originally provided by information source 120. However, in some cases, insufficient bandwidth exists to perform sufficient iterations to derive the desired result. In other cases, too many errors exist in transmitted data set 150, and thus the desired result is not achievable using standard LDPC decoder 180.

Hence, for at least the aforementioned reasons, there exists a need in the art for advanced systems and methods for decoding information.

BRIEF SUMMARY OF THE INVENTION

The present invention is related to systems and methods for decoding information, and more particularly to systems and methods for LDPC decoding with post processing.

Various embodiments of the present invention provide systems and methods for decoding encoded information. For example, a method for post processing error correction in a decoder system is disclosed. The method includes receiving and decoding a soft input to generate a hard output associated with the soft input. The method further includes applying a plurality of parity checks to the hard output such that a subset of the plurality of parity checks fail. At least one bit of the hard output is identified as being potentially incorrect. The identified bit is modified, and the plurality of parity checks is thereafter repeated. In some instances of the aforementioned embodiments, the decoding is iterative LDPC decoding.

In various instances of the aforementioned embodiments, the methods further include determining that the plurality of parity checks passed after modifying the at least one bit, and outputting the hard output with the at least one bit modified. In some instances, identifying the at least one bit that is a potential error includes determining a frequency of association of the identified bit with a subset of the plurality of parity checks that failed. In such instances, the frequency of association of the identified bit is greater than a frequency of association with the subset of parity checks of another bit in the hard output.

Other embodiments of the present invention provide systems for performing LDPC decoding. The systems include an LDPC decoder that receives a soft input that is decoded to provide a hard output, and a post processor. The post processor identifies at least one bit in the hard output that is potentially incorrect, modifies the identified bit that is potentially incorrect, and determines whether the modifying the at least one bit eliminated the potential error in the hard output. In some instances of the aforementioned embodiments, the soft input is a reliability of received bits. In various instances of the aforementioned embodiments, identifying the potential error in one or more bits of the hard output includes determining if one or more parity checks performed on the hard output failed. In such instances, determining whether the modifying the one or more bits of the hard output eliminated the potential error includes executing the one or more parity checks to determine if any of the one or more parity checks indicates an error.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for decoding information, and more particularly to systems and methods for LDPC decoding with post processing.

Figure 2:
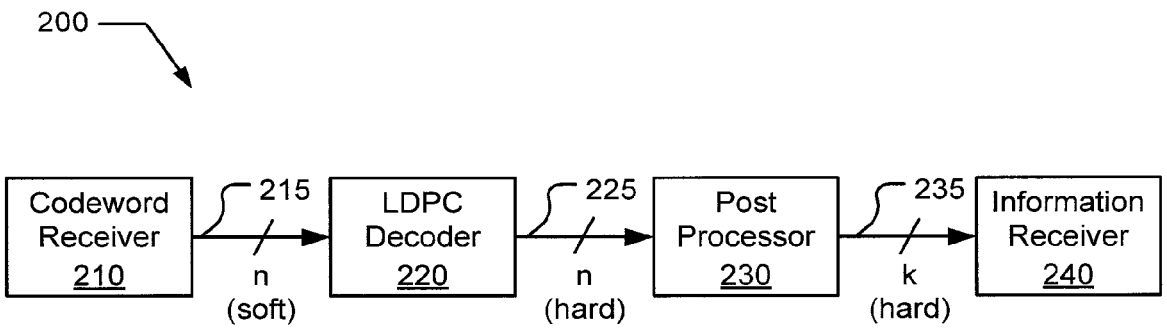
FIG. 2 is a decoder system including a post processor in accordance with one or more embodiment of the present invention.

Turning to FIG. 2, a decoder system 200 including a post processor 230 is depicted in accordance with one or more embodiments of the present invention. Decoder system 200 includes a code word receiver 210, an LDPC decoder 220, a post processor 230, and an information receiver 240. Codeword receiver 210 may be any circuit or device capable of receiving an encoded data set. Thus, as just some examples, codeword receiver 210 may be, but is not limited to, a read channel associated with a magnetic storage medium, a receiver in a cellular telephone, or the like. LDPC decoder 220 may be any LDPC decoder capable of receiving a soft input and providing a decoded output therefrom. Post processor 230 may be any processor capable of receiving a decoded output and providing error checking and/or error correction on the decoded output. Information receiver 240 may be any device or system capable of accepting decoded information. Thus, for example, information receiver 240 may be, but is not limited to, a processor, a memory system, or the like.

In operation, codeword receiver 210 receives a codeword that is passed to LDPC decoder as a soft output 215 n-bits in length. As used herein, the phrases "soft input" or "soft output" are used in their broadest sense to mean respectively any output or input that includes probability information. Thus, for example, a soft input may include a number of bits that are each associated with or represented by a probability that the bit is correct. LDPC decoder 220 performs LDPC decoding as is known in the art to provide a decoded output 225 to post processor 230. As one example, LDPC decoder 220 may perform a sum-product iterative decoding algorithm described in Moon, Todd K., "Error Correction Coding", section 15.5, John Wiley and Sons Inc., Hoboken, N.J., 2005. The entirety of the aforementioned reference is incorporated herein by reference for all purposes. Based on the disclosure provided herein, one of ordinary skill in the art will recognize a variety of different LDPC decoding approaches and even other systematic block decoding processes that may be used in relation to one or more embodiments of the present invention.

Decoded output 225 is a hard output n-bits in length. As used herein, the phrases "hard input" or "soft input" are used in their broadest sense to mean respectively any output or input represented as absolute values. Thus, for example, a hard output may be a series of binary values without any interim probability information. Post processor 230 determines whether any errors remain in decoded output 225 after LDPC decoding, and if any, which bits of decoded output are most likely incorrect. Post processor 230 then applies one or more algorithms to correct any remaining errors. Once the errors are reduced or eliminated, post processor 230 strips any redundancy information from decoded output 225 and provides the stripped data as an output 235. Output 235 is k-bits in length, and represents the most likely and in many cases the actual information that was originally encoded using an LDPC encoding process.

In some embodiments of the present invention, post processor 230 determines which bits are associated with a number of different parity checks, and which of the included bits are more frequently associated with failed parity error checks. These more frequently involved bits are identified as possible sources of the remaining error(s). Post processor 230 may then modify each of the identified bits either individually or in combination and re-run the parity checks. This process continues until either all of the parity checks indicate that there are no remaining errors, until all possible combinations modifying the identified probable error bits have been exhausted, or until the process timed out. Upon identifying the condition where all of the parity checks indicate that there are no remaining errors, post processor 230 provides the corrected codeword to information receiver 240. In some cases, the process times out or all possibilities are exhausted. In such cases, either the codeword originally provided from LDPC decoder 220 or the most likely codeword are provided to information receiver 240 along with an indication that an error occurred. Based on the disclosure provided herein, one of ordinary skill in the art will recognize other post processing approaches and/or modifications to the previously described post processing approach that may be used in accordance with one or more embodiments of the present invention.

Among other things, one or more embodiments of the present invention may reduce the bandwidth required to obtain a result when compared with operating LDPC decoder 220 to its conclusion. Thus, LDPC decoding may be used in situations demanding high throughput and/or allowing for implementation with less chip area. Based on the disclosure provided herein, one of ordinary skill in the art will recognize a variety of other advantages that may be had through use of different embodiments of the present invention.

Figure 3A:
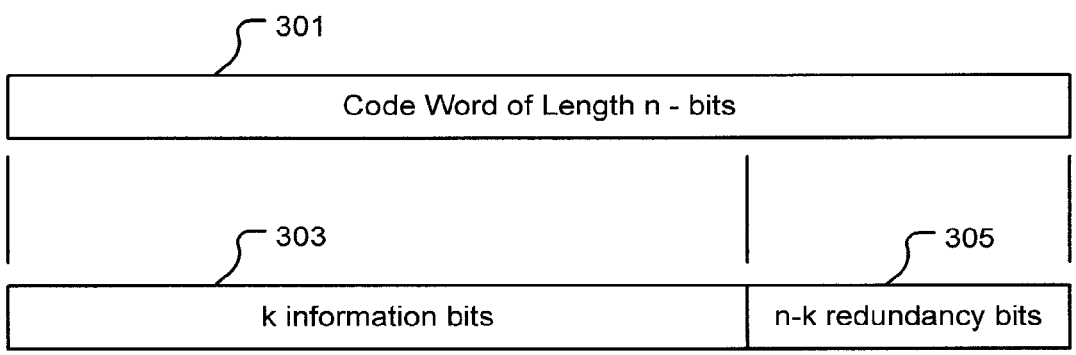
FIGS. 3$a$-3$c$ depict an exemplary LDPC decoding process that may be employed in relation to one or more embodiments of the present invention.
Figures 3B, 3C:
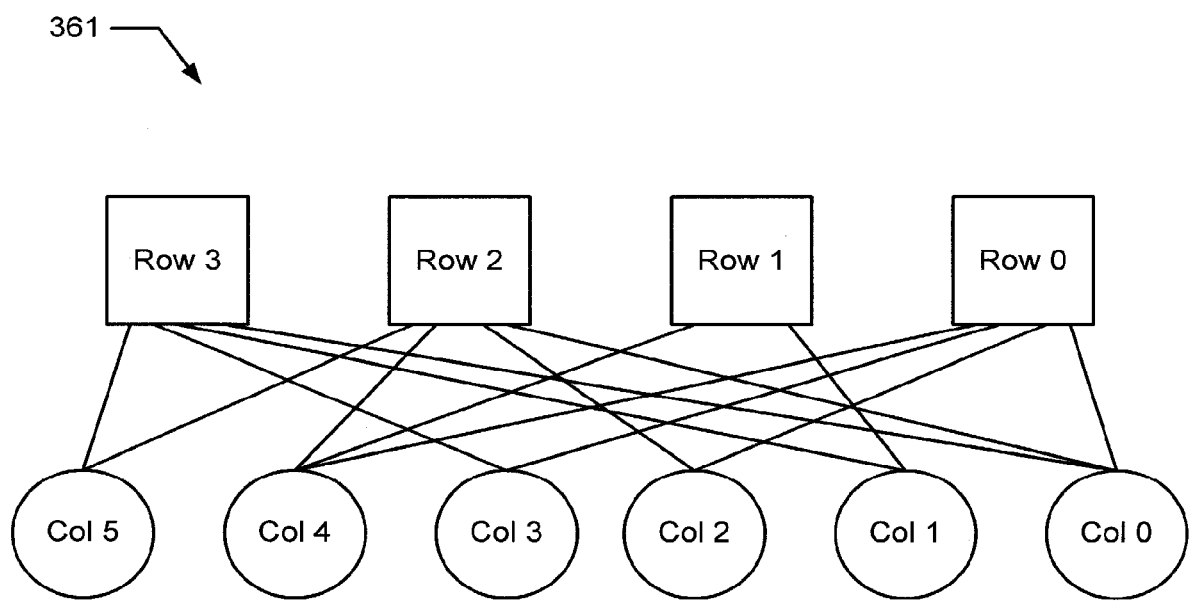

Turning to FIGS. 3a-3c, an exemplary received information 301 and LDPC decoding process is described. It should be emphasized that the described decoding process is merely exemplary, and that codewords of differing length may be processed in accordance with embodiments of the present invention. Further, it should be noted that the depicted decoding matrix is merely exemplary and that a number of different decoding matrices may be implemented in accordance with different embodiments of the present invention depending upon, among other things, the length of codewords that are to be processed and the amount of redundancy utilized in the system. Based on the disclosure provided herein, one of ordinary skill in the art will recognize a variety of different codewords, decoding matrices, and/or redundancy that may be used in relation to different embodiments of the present invention.

As shown in FIG. 3a, received information 301 includes n-bits. The n-bits include k information bits 303 and (n-k) redundancy bits 305. Information bits 303 represent data that is originally received prior to encoding, and redundancy bits 305 represent bits that are added to information bits 303 during the encoding process. In this example, n is six and k is four. Received information 301 from a transmission channel is a soft input consisting of a number of probabilities not only indicating the particular binary value of the bits in the codeword, but also the probability that the particular bits have been correctly predicted. For this example, assume each of the bits is represented by a ten where the bit is a one with a one hundred percent probability of being correct. When the probability is zero, the bit has a value of zero. Other probabilities are linearly represented between zero and ten. The bits are represented by a negative ten when the bit is a zero with a one hundred percent likelihood of being correct, and a zero when the probability is zero. Again, other probabilities are linearly represented between zero and negative ten.

In decoding received information 301, a decoding matrix 311 is utilized. In the abstract, where product of the codeword multiplied by matrix 311 is equal to zero, a correct codeword has been identified. Where the matrix multiplication does not yield a zero, one or more errors remain in an estimation of received information 301. Iterative LDPC decoding performs a process of iteratively modifying received information 301 until the zero result is achieved. As the result of the iterative multiplication converges, increased confidence in received information 301 is achieved. In some cases, only a limited number of iterations may be performed to conserve both bandwidth and chip area. In such cases, convergence may not be possible and one or more errors remain in the codeword reported by LDPC decoder 220. In embodiments of the present invention, post processor 230 operates to correct the remaining errors using only limited bandwidth and chip area. Thus, as previously mentioned, among other things, various embodiments of the present invention provide higher bandwidth LDPC decoding and/or reduced chip area. Based on the disclosure provided herein, one of ordinary skill in the art will recognize additional advantages that attend the various embodiments of the present invention.

A generator matrix corresponding to the parity matrix is used to encode information 303 to produce received information 301. As will be appreciated by one of ordinary skill in the art, matrix 311 is merely exemplary and a number of decoding matrices may be used in accordance with the embodiments of the present invention depending upon a desired codeword length and implemented redundancy. Matrix 311 includes a number of columns 313 and a number of rows 315. The number of columns 313 corresponds to the length of received information 301. Thus, in this case, received information 301 is six bits in length. The number of rows 315 corresponds to the implemented redundancy applied to information bits 303. In particular, each of rows 315 corresponds to a different parity check that is built into received information 301 by a preceding encoding process.

Matrix 311 may be represented by a Tanner diagram 361 that displays the relationship between the rows 315 and columns 313 of matrix 311. In particular, there is a circle for each column of matrix 311, and a square for each row of matrix 311. Where there is a binary '1' in matrix 311, it is represented by a path between the circle and square corresponding to location of the '1' in the matrix. Thus, where there is a '1' corresponding to the intersection of column five and row three, a path is drawn between the square representing row three and the circle representing column five. Alternatively, where there is not a '1' at the intersection column four and row three, there is not a path drawn between the square representing row three and the circle representing column 4. Tanner diagram 361 shows all of the paths corresponding to the row/column intersections in matrix 311.

Tanner diagram 361 provides an effective graphic for discussing the decoding algorithm. The algorithm begins by applying the probability value of each of the individual bits of received information 301 to the circle corresponding to the respective bit. To illustrate, the following exemplary probability values for received information 301 are used for codeword[5 . . . 0] 301: 10, 9, −5, −6, −9 and 9. The value of 10 corresponding to bit 5 of received information 301 is assigned to the circle corresponding to column 5; the value of 9 corresponding to bit 4 of received information 301 is assigned to the circle corresponding to column 4; the value of −5 corresponding to bit 3 of received information 301 is assigned to the circle corresponding to column 3; the value of −6 corresponding to bit 2 of received information 301 is assigned to the circle corresponding to column 2; the value of −9 corresponding to bit 1 of received information 301 is assigned to the circle corresponding to column 1; and the value of 9 corresponding to bit 0 of received information 301 is assigned to the circle corresponding to column 0. These values are then applied to a formula implemented by each of the boxes corresponding to the respective rows. The formula may be any number of formulas as are known in the art, however, for the purposes of this illustration the following formula is applied:

$$\text{row result} = f(\Sigma f(\text{column value})),$$

where the function f(x) is the decoding function. The value for each of the row results is then transferred back to each circle attached to the row via a path of Tanner diagram 361 where the various results are aggregated. Another iteration is then performed using the newly identified values in the circles and the process is repeated. This process continually accumulates the probability data. Where only a limited number of errors exist in received information 301, over a number of iterations the values maintained in the circles corresponding to the respective columns represents the decoded codeword. Thus, assume the aforementioned process ends with the following decoded codeword: 10, 5, −7, 5, −9 and 10. In this case, the hard output corresponding to the decoded codeword would be: 1, 1, 0, 1, 0, 1.

As previously stated, a correct codeword is found where matrix 311 multiplied by the hard output of LDPC decoder 220 is equivalent to zero. Again, this may not always be possible due to, for example, a limit on the number of LDPC iterations performed in the LDPC decoding process. In such cases, it is possible that the product of the multiplication of the decoded codeword by matrix 311 will yield a zero in relation to some rows of the result matrix, but not all. This corresponds to passing a parity check corresponding to some rows (i.e., the rows yielding a zero) and failing a parity check corresponding to other rows (i.e., the rows yielding a non-zero result). These pass and fail results may be used in combination with Tanner graph 361 to describe a process in accordance with embodiments of the present invention for resolving errors remaining in the decoded codeword at the completion of LDPC decoding.

Figure 4:
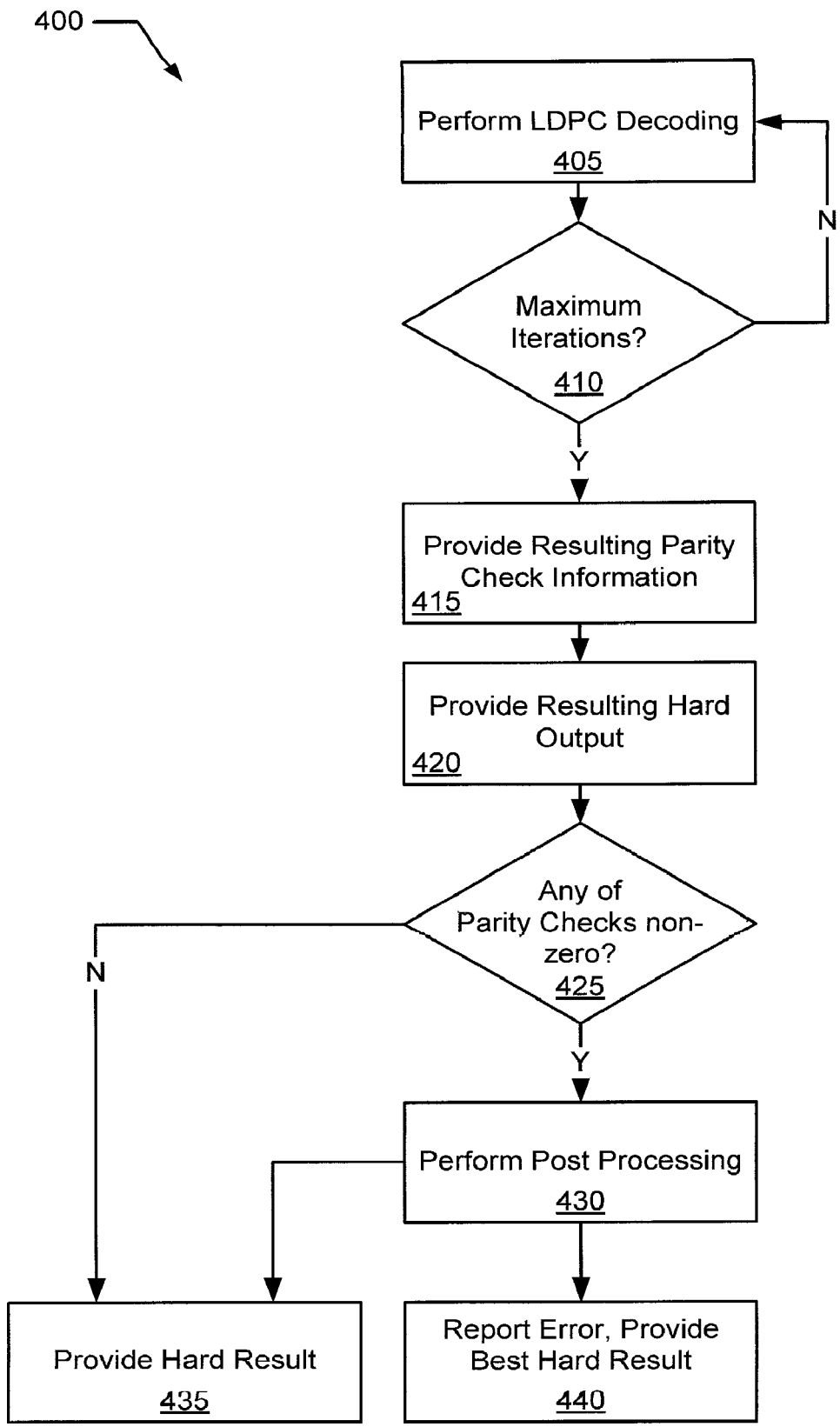
FIGS. 4 and 5 are flow diagrams showing decoding including post processing in accordance with various embodiments of the present invention for encoding and decoding information.
Figure 5:
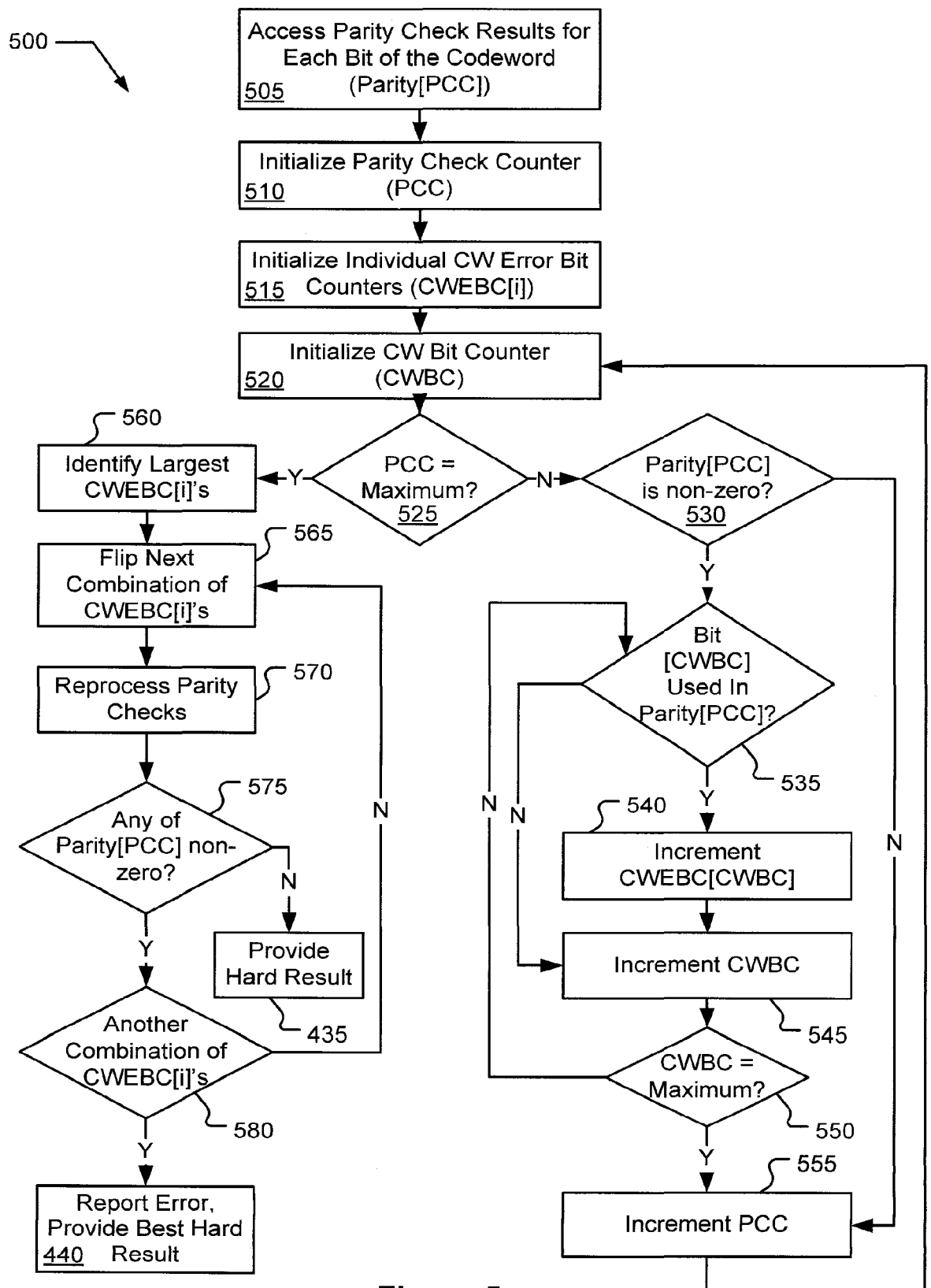

Turning to FIG. 4 and FIG. 5, the process of using the results of parity checks upon completion of the LDPC decoding is discussed. In particular, FIG. 4 shows the process implemented by LDPC decoder 220 and an abstracted view of the processes implemented by post processor 230. A more detailed view of the process that may be implemented in one or more embodiments of post processor 230 is depicted in FIG. 5. Following flow diagram 400, an encoded codeword is received and LDPC encoding is performed on the codeword (block 405). This encoding may proceed as discussed above in relation to FIGS. 3a-3c above, or using another approach to LDPC encoding known in the art. Upon completing each iteration of the LDPC decoding, it is determined if a maximum number of LDPC decoding iterations have been completed (block 410). The maximum number of LDPC decoder iterations may be selected based on a desired throughput of the LDPC decoder (i.e., based on a desired bandwidth of LDPC the LDPC decoder). In an ideal situation, a large number of iterations would be performed to allow the decoding algorithm to converge on the correct codeword. However, in some cases, convergence is either not possible due to a large number of errors in the received codeword, or insufficient available processing time to allow the decoding algorithm to converge.

Where the maximum number of iterations have not yet been performed (block 410), another LDPC decoding iteration is performed (block 405). The process of LDPC decoding continues to iterate until the maximum number of iterations has been achieved. Where the maximum number of LDPC iterations have been performed (block 410), processing is turned over to the post processor (block 415). At this point, the resulting parity check results are provided to the post processor (block 415) along with the hard output representing the decoded codeword (block 420).

The post processor then determines if any of the received parity check results are non-zero (block 425). As previously discussed, a non-zero parity check indicates one or more remaining bit errors in the hard codeword received from the LDPC decoder. Where there are not any non-zero parity checks (block 425) indicating no remaining bit errors in the hard codeword, the hard result is provided as an output (block 435). Alternatively, where one or more of the parity checks are non-zero (block 425) indicating one or more remaining bit errors in the hard codeword, post processing on the hard codeword received from the LDPC decoder is performed (block 430). Post processing includes determining one or more likely error bits within the hard code word based on the received parity check information. Using this information, the most likely error bits are sequentially modified until either the parity check equations do not include any remaining non-zero results or until all bit modification possibilities are exhausted. Where the parity check equations result in all zero results, the resulting hard code word including the modified bits is provided as an output (block 435). Alternatively, where the possibilities are exhausted and the parity checks still indicate one or more non-zero results, the hard codeword including bit modifications that coincide with the least likely remaining error bits is reported along with an error indication (block 440).

An exemplary implementation process for performing the post processing of block 430 in accordance with one or more embodiments of the present invention is discussed in greater detail in relation to a flow diagram 500 of FIG. 5. Following flow diagram 500, the parity check results reported from the LDPC decoder are accessed (block 505). These results may be maintained in an array of parity check results (i.e., Parity [PCC], where PCC ranges from zero to the number of parity checks less one). There is one parity check result associated with each of the squares in Tanner diagram 361. Thus, continuing with the example discussed in relation to FIG. 3*a*-3*c* above, there are four parity check results (i.e., one parity check result associated with each row in matrix 311). It should again be noted that matrix 311 and the encoding associated therewith is merely exemplary, and that other matrices may be used in accordance with one or more embodiments of the present invention. Thus, there may be more or fewer than the exemplary four parity checks in various implementations of the embodiments of the present invention.

In addition, a parity check counter (PCC) is initialized to zero (block 510), and a number of codeword error bit counters (CWEBC[i]) are initialized to zero (block 520). The parity check counter is used to count through each of the parity checks that are received from the LDPC decoder. Thus, following the example of FIGS. 3 where four parity check results are available, the parity check counter increments from one to three as each of the parity check results are accessed. Once the parity check counter has incremented to four (i.e., greater than the number of parity checks available), all of the parity check results will have been utilized. There is one codeword error bit counter (CWEBC[i]) for each bit in the codeword received from the LDPC decoder. Thus, following the example of FIGS. 3 where the codeword is six bits long, the value of 'i' ranges from zero to five with each position representing a respective one of the six bits in the codeword. Each of these counters is used to account for the number of times that each bit in the received codeword is associated with a parity check result that indicates an error. Further, a codeword bit counter (CWBC) is initialized to zero (block 520). The codeword bit counter is used to count individual bits of the hard codeword received from the LDPC decoder. At this junction, it should be noted that flow diagram 500 represents one particular method in accordance with some embodiments of the present invention, and that a variety of flow diagrams illustrating various implementations of one or more embodiments of the present invention. As one example, while shown in flow diagram 500, the CWBC counter is not necessary and various implementations of the present invention may eliminate use of the CWBC counter. Based on the disclosure provided herein, one of ordinary skill in the art will recognize a variety of implementations using different counters and/or index tools.

It is then determined if all of the parity checks have been examined in the process (block 525). Thus, following the example of FIGS. 3 where four parity check results are available, it is determined if the parity check counter has been incremented passed three as there are four parity checks that are to be examined. Where the parity check count is not yet equal to the maximum (block 525), the next parity check is processed in blocks 530 through 555. Alternatively, where the parity check count is equal to the maximum (block 525), an error correction process of blocks 560 through 590 is performed using the information identified in the parity check processing.

Processing each of the parity checks includes determining whether the parity check exhibits a non-zero result (block 530). Where the current parity check (i.e., Parity[PCC]) is non-zero (block 530), one or more bits of the codeword used in the particular parity check is incorrect. In such a situation, a counter (CWEBC[i]) associated with each bit used to calculate the parity check under current examination is incremented indicating that it may be part of the error identified by the parity check (block 535 and block 540). The matrix used for decoding provides an indication of which bits of a codeword are used in each of the parity checks. In particular, each row of the matrix represents an individual parity check and each one indicates a bit in the codeword that plays a part in the particular parity check. Thus, following the example of FIGS. 3 there are four parity checks corresponding to respective rows of matrix 311 (Parity[3 . . . 0]). In this case, Parity[3] is developed using bit five, bit three, bit one and bit zero of the codeword. This information is graphically depicted in Tanner graph 361 by the paths extending from the square associated with Row 3. Similarly, Parity[2] is developed using bit five, bit four, bit two and bit zero; Parity[1] is developed using bit four and bit one; and Parity[0] is developed using bit four, bit three and bit zero.

Where a bit is not used in the parity check under examination (block 535), the counter (i.e., CWEBC[CWBC]) associated with the particular bit is not incremented. The process of checking each bit to determine if it played a part in the parity check under examination continues sequentially through each bit position of the codeword through incrementing the codeword bit counter (block 545). It is then determined if all of the bits in the parity check under examination have been examined (block 550). All of the bits have been examined when the codeword bit counter exceeds the number of bits of the provided codeword. Thus, following the example of FIGS. 3 where the codeword is six bits long, when the codeword bit counter equals six, all of the bits have been examined. Where all of the bits have not yet been examined (block 550), the processes of block 535 through block 550 are repeated for the next codeword bit. Alternatively, where all of the codeword bits have been examined (block 550), the parity check counter is incremented (block 555), and the processes of block 520 through block 555 are repeated for the next parity check.

Where the parity check counter indicates that all of the parity checks have been examined (block 525), the codeword bits that are associated with the largest number of parity check failures are identified as potential error bits (block 560). The identified bits of the codeword are then modified one at a time and/or in combinations (block 565). After modifying the bits (block 565), each of the parity checks are again processed using the newly modified codeword (block 570). Where all of the parity checks provide a zero result (block 575), the newly modified codeword is identified as correct and provided as a hard result (block 435).

Alternatively, where one or more of the parity checks indicates a non-zero result (block 575), it is determined if there are other potential bits of the codeword of combinations thereof that have not yet been considered (block 580). Where other bits or combinations thereof remain to be checked (block 580), the processes of block 565 to block 580 are repeated for the next possible bit modification. Alternatively, where the possibilities have been exhausted (block 580), the most likely hard codeword is provided along with an indication of a likely error remaining in the codeword (block 440).

At this point, an example of the process of FIG. 4 and FIG. 5 is provided. Assume that matrix 311 is used indicating a codeword length of six bits and four parity checks. The LDPC processing of block 405 and block 410 is repeated until the maximum number of iterations have been accomplished. Assume at this point that a hard codeword is provided by the LDPC decoder that fails the parity checks associated with Row 2 and Row 0, and passes the parity checks associated with Row 3 and Row 1. PCC, each of CWBC[i] and CWBC are each initialized to zero. As the parity check of Row 0 failed, Row 0 of matrix 311 is examined bit by bit (block 530-block 550). Using matrix 311, CWEBC[0] is incremented as there is a '1' in the zero bit position of Row 0 of matrix 311 (block 535 and block 540). In contrast, CWEBC[1] is not incremented as there is a '0' in the one bit position of Row 0 of matrix 311 (block 535). This process is repeated for each bit of Row 0 of matrix 311. This results in the following counters being incremented in addition to CWEBC[0]: CWEBC[2], CWEBC[3] and CWEBC[4].

Once all of the bits of Row 0 have been considered (block 550), the parity check counter is incremented (block 555) indicating that the parity check associated with Row 1 will now be examined. The parity check corresponding to Row 1 is passed over (block 530) as it indicates a correct result. The parity check counter is then incremented (block 555) indicating that the parity check associated with Row 2 will now be examined. The codeword bit counter is reset to zero (block 520) and the parity check corresponding to Row 2 is examined bit by bit as it is non-zero (block 530). Using matrix 311, CWEBC[0] is incremented as there is a '1' in the zero bit position of Row 2 of matrix 311 (block 535 and block 540). In contrast, CWEBC[1] is not incremented as there is a '0' in the one bit position of Row 2 of matrix 311 (block 535). This process is repeated for each bit of Row 2 of matrix 311. This results in the following counters being incremented in addition to CWEBC[0]: CWEBC[2], CWEBC[4] and CWEBC[5]. Once all of the bits of Row 2 have been considered (block 550), the parity check counter is incremented (block 555) indicating that the parity check associated with Row 3 will now be examined. As the parity check for Row 3 is zero, it is passed over as it does not indicate an error (block 530).

At this point, all four parity checks corresponding to ROWS 0-3 of matrix 311 have been examined and result processing is initiated (block 525). In this case, the CWEBC[i] counters have the following values: CWEBC[5]=1; CWEBC[4]=2; CWEBC[3]=1; CWEBC[2]=2; CWEBC[1]=0; and CWEBC[0]=2. The bits associated with the largest count values are then identified as potential error bits (block 560). In this case, the zero, two and four bits of the six bit codeword are identified as potentially incorrect as each exhibit a count of two (i.e., CWEBC[4]=2; CWEBC[2]=2 and CWEBC[0]=2). This leaves seven possible bit combinations (i.e., 23 combinations less the existing incorrect combination) that may be tried to determine which of the aforementioned bits may be incorrect. For this, assume that the hard codeword reported by the LDPC decoder is: 1 0 1 0 1 0.

The following Table 1 shows an exemplary output of the parity checks where each of bits four, two and zero are modified:

TABLE 1

Exemplary Parity Results

| Bit Combination [4, 2, 0] | Row 3 Parity | Row 2 Parity | Row 1 Parity | Row 0 Parity |
|---|---|---|---|---|
| 000 | zero | non-zero | zero | non-zero |
| 001 | non-zero | zero | zero | zero |
| 010 | zero | non-zero | zero | zero |
| 011 | non-zero | non-zero | zero | zero |
| 100 | zero | non-zero | zero | zero |
| 101 | zero | zero | zero | zero |
| 110 | non-zero | non-zero | non-zero | non-zero |
| 111 | non-zero | zero | non-zero | zero |

In this case, switching the zero and the four bit of the codeword received from the LDPC decoder from zero to a one (block 565) causes a zero result in all four parity checks (block 570). Thus, the reported hard codeword (block 435) is: 1 1 1 0 1 1. It should be noted that the foregoing is merely an example of the process and that a variety of different bit manipulations and parity check results are possible depending upon the codeword received from the LDPC decoder, the decoding matrix that is used, the length of the codeword, and a variety of other variables. Based on the disclosure provided herein, one of ordinary skill in the art will recognize a variety of possibilities that may occur in relation to one or more embodiments of the present invention.

Figure 1A:
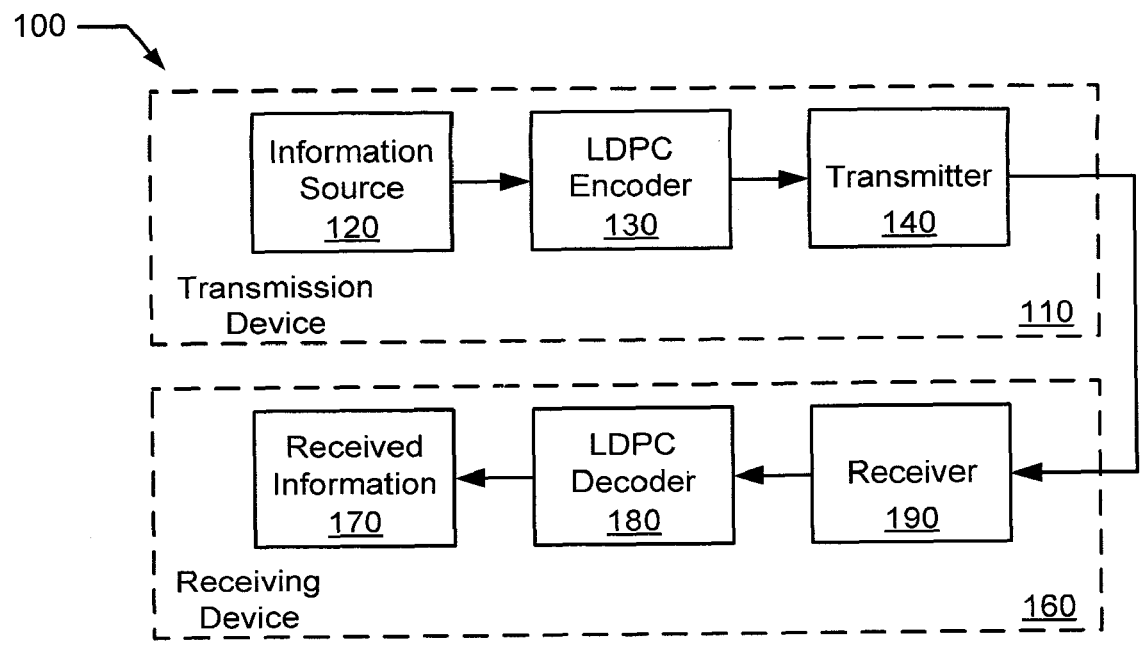
FIG. 1 is a prior art transmission system including an LDPC encoder and a separate LDPC decoder.
Figure 6:
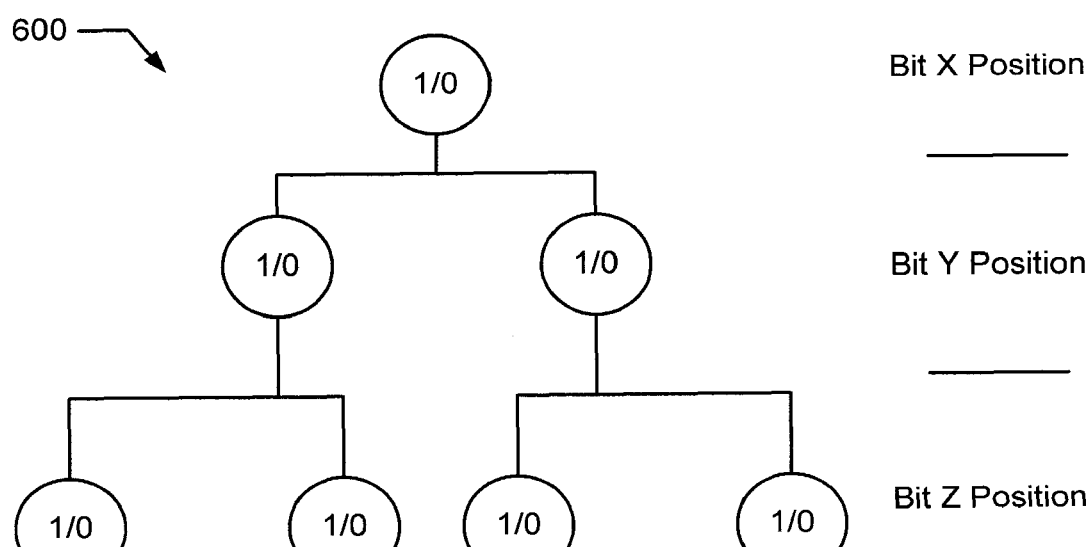
FIG. 6 is a graphical depiction of a decision tree that may be followed for determining bit modification in a codeword used to test parity accuracy in accordance with some embodiments of the present invention.

Some embodiments of the present invention use a decision tree process for determining which combination of bits to flip (block 565) when more than one bit is reported as a possible error as was the case in the preceding example. As one example, list decoding may be performed following a decision tree 600 of FIG. 6 to test all possible combinations. As shown, decision tree 600 outlines bit modification where three possible error bits are identified: Bit X, Bit Y, Bit Z. In operation, Bit X may be set to a logic '0' and Bit Y is set to a logic '0'. Then, Bit Z is tested in its two possible settings. If a solution is not found, Bit Y is flipped to a logic '1', and Bit Z is switched between its two possible settings. If a solution is still not found, Bit X is switched to a logic '1', and the process of flipping Bit Y and Bit Z is continued until a solution is identified. It should be noted that larger or smaller decision trees similar to decision tree 600 may be used where more or fewer than three potential error bits are identified. Based on the disclosure provided herein, one of ordinary skill in the art will recognize a variety of methodologies that may be used to select combinations of bit modifications to be re-checked using the parity checks (block 565) in accordance with different embodiments of the present invention. It should be noted that the preceding example is somewhat simple and does not exhibit enough minimum distance to correct errors, but it does demonstrate post processing in accordance with one or more embodiments of the present invention. Based on the disclosure provided herein, one of ordinary skill in the art will recognize many applications and examples in accordance with the various embodiments of the present invention including sufficient minimum distance.

In conclusion, the invention provides novel systems, devices, methods and arrangements for decoding encoded information. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A system for performing LDPC decoding, the system comprising:
   an LDPC decoder, wherein the LDPC decoder receives a soft input that is decoded to provide a hard output; and
   a post processor, wherein the post processor identifies at least one bit in the hard output that is potentially incorrect, wherein the post processor modifies the at least one bit that is potentially incorrect, and wherein the post processor determines whether the modifying the at least one bit eliminated the potential error in the hard output.

2. The system of claim 1, wherein the soft input is a reliability of a codeword bit, and wherein the length of the codeword is the same as the length of the hard output.

3. The system of claim 1, wherein identifying the potential error in one or more bits of the hard output includes determining if one or more parity checks performed on the hard output failed.

4. The system of claim 3, wherein determining whether the modifying the one or more bits of the hard output eliminated the potential error includes executing the one or more parity checks to determine if any of the one or more parity checks indicates an error.

5. The system of claim 1, wherein two or more parity checks are executed on the hard code word, wherein identifying the potential error in one or more bits of the hard output includes determining that at least a first parity check and a second parity check of the two or more parity checks performed on the hard output failed.

6. The system of claim 5, wherein the first parity check operates on at least a first and a second bit of the hard output, wherein the second parity check operates on the first and a third bit of the hard output.

7. The system of claim 6, wherein the first bit of the hard output is indicated as a potential error because it is operated on by both the first parity check and the second parity check.

8. The system of claim 7, wherein the post processor modifies the first bit of the hard output, and wherein the post processor executes the two or more parity checks on the hard output after modifying the first bit of the hard output.

9. The system of claim 8, wherein the post processor determines that the two or more parity checks passed after modifying the first bit of the hard output, and wherein the post processor outputs the hard output with the first bit modified.

10. The system of claim 8, wherein the post processor determines that at least one of the two or more parity checks failed after modifying the first bit of the hard output.

11. The system of claim 10, wherein a fourth bit of the hard output is also identified as a potential error, wherein the post processor modifies the fourth bit of the hard output, and wherein the post processor executes the two or more parity checks on the hard output after modifying the fourth bit of the hard output.

12. The system of claim 11, wherein the post processor determines that the two or more parity checks passed after modifying the fourth bit of the hard output, and wherein the post processor outputs the hard output with the fourth bit modified.

13. A method for LDPC decoding, the method comprising:
   receiving a soft input;
   performing LDPC decoding on the soft input, wherein the LDPC decoding generates a hard output corresponding to the soft input;
   applying at least a first parity check and a second parity check to the hard output, wherein at least one of the first parity check and the second parity check indicates an error in the hard output;
   identifying at least one bit in the hard output that is a potential error;
   modifying the at least one bit; and
   applying the first parity check and the second parity check to the hard output after modifying the at least one bit.

14. The method of claim 13, wherein the method further comprises:
   determining that the first parity check and the second parity check passed after modifying the at least one bit; and
   outputting the hard output with the at least one bit modified.

15. The method of claim 13, wherein identifying the at least one bit that is a potential error comprises:
   determining a frequency of association of the identified bit with the first parity check and the second parity check.

16. The method of claim 15, wherein the frequency of association of the identified bit is greater than a frequency of association with the first parity check and the second parity check of another bit in the hard output.

17. A method for post processing error correction in a decoder system, the method comprising:
   receiving a soft input;
   decoding the soft input, wherein a hard output is generated;
   applying a plurality of parity checks to the hard output, wherein a subset of the plurality of parity checks fail;
   identifying at least one bit in the hard output that is a potential error;
   modifying the at least one bit; and
   applying the plurality of parity checks to the hard output after modifying the at least one bit.

18. The method of claim 17, the method comprising:
   determining that the plurality of parity checks passed after modifying the at least one bit; and
   outputting the hard output with the at least one bit modified.

19. The method of claim 17, wherein identifying the at least one bit that is a potential error comprises:
   determining a frequency of association of the identified bit with a subset of the plurality of parity checks that failed.

20. The method of claim 19, wherein the frequency of association of the identified bit is greater than a frequency of association with the subset of parity checks of another bit in the hard output.

* * * * *